United States Patent [19]

Napoli et al.

[11] 3,855,613

[45] Dec. 17, 1974

[54] SOLID STATE SWITCH USING AN IMPROVED JUNCTION FIELD EFFECT TRANSISTOR

[75] Inventors: Louis Sebastian Napoli, Hamilton Square; Raymond Harkless Dean, Lawrenceville, both of N.J.

[73] Assignee: RCA Corporation, New York, N.Y.

[22] Filed: June 22, 1973

[21] Appl. No.: 372,648

[52] U.S. Cl. ........................ 357/22, 307/304, 357/89
[51] Int. Cl. ........................ H01l 11/00, H01l 15/00
[58] Field of Search .............. 317/235, 21, 22, 21.1, 317/48.1, 48.9, 21.3, 22.1; 307/304

[56] References Cited

UNITED STATES PATENTS

| | | | |
|---|---|---|---|
| 2,816,847 | 12/1957 | Shockley | 317/235 A |
| 3,316,131 | 4/1967 | Wisman | 317/235 A |
| 3,405,330 | 10/1968 | Hilbiber | 317/235 A |
| 3,413,531 | 11/1968 | Leith | 317/235 A X |
| 3,421,952 | 1/1969 | Conrad et al. | 317/235 AL |
| 3,538,399 | 11/1970 | Bresee et al. | 317/235 A |
| 3,657,615 | 4/1972 | Driver | 317/235 A |
| 3,725,136 | 4/1973 | Morgan | 317/235 AM |

*Primary Examiner*—Andrew J. James
*Attorney, Agent, or Firm*—Edward J. Norton; Joseph D. Lazar

[57] ABSTRACT

The transistor is especially useful for high frequency switching applications. A conductive path between ohmic contacts will pass high frequency signals with very little impedance. The conductive path is comprised of a doped semiconductor layer of one conductivity type to which ohmic contacts are attached. The substrate of the device which underlies the layer is heavily doped with deep impurities of opposite conductivity type so that it has a high resistivity. The high resistivity of the substrate isolates the driving voltage used to switch the device from the signal passed between the ohmic contacts. The device can be turned "OFF" by reverse biasing the PN junction formed between the substrate and the layer. This is accomplished by imposing a driver voltage between one of the ohmic contacts and a metallic contact connected to the substrate.

10 Claims, 5 Drawing Figures

SOLID STATE SWITCH USING AN IMPROVED JUNCTION FIELD EFFECT TRANSISTOR

BACKGROUND OF THE INVENTION

The present invention relates to an improved solid state field effect switching device, and more particularly to an improved junction field effect transistor which is particularly useful in switching applications at microwave frequencies. In particular, the device of the present invention may be used as an efficient microwave switch as it has a very low impedance "ON" characteristic and a high impedance, low capacitance "OFF" characteristic. In addition, the device requires very little power and a very short time to switch from the "ON" state to the "OFF" state.

Electronic circuits and systems often require switches in order to direct the flow of signals. It is often desirable to have these switches electronically controlled so that fast, circuit controlled switching can be accomplished. In particular, certain types of circuits and systems require extremely high speed switching elements for their operation. An example of a system where such switching elements are essential is a phased array radar. A phased array radar is a system which employs a number of individual fixed antenna elements. By applying the radar signal through various delays to different antenna elements, the signal is effectively swept without moving any of the antenna elements. In order to properly operate such a radar system, however, it is essential to have an electronically controlled switching device capable of operation at microwave frequencies.

Heretofore, there have been problems with such solid state switching elements. Some of the prior art devices had too much capacitive coupling to have the desired high impedance "OFF" characteristic at very high frequencies. Other devices, such as PIN diodes, cannot be driven by low voltage levels. The high power required by such switching elements becomes prohibitive in a system such as a phased array radar which may require thousands of switching elements.

An ideal high frequency switching device should have a low impedance "ON" characteristic and a high impedance, low capacitance "OFF" characteristic. Furthermore, it should require a minimal amount of voltage to drive the switch, and the time required to switch states must be extremely short. Finally, the signal circuit should be effectively isolated from the switching circuit.

SUMMARY OF THE INVENTION

A solid state switch is presented which comprises a substrate of a first conductivity type having a high resistivity and a high impurity concentration. A layer of a second conductivity type on the substrate forms a PN junction with the substrate. At least two ohmic contacts on the layer provide terminals for a signal to be switched by the transistor. A metallic contact on the side of the substrate opposite the PN junction is used to connect a driver circuit to the transistor. The driving signal is isolated from the switched signal by the high resistivity substrate. The switch is operated by reverse biasing the PN junction thereby depleting the layer of carriers and turning the switch "off."

DETAILED DESCRIPTION OF THE DRAWINGS

Figure 2:
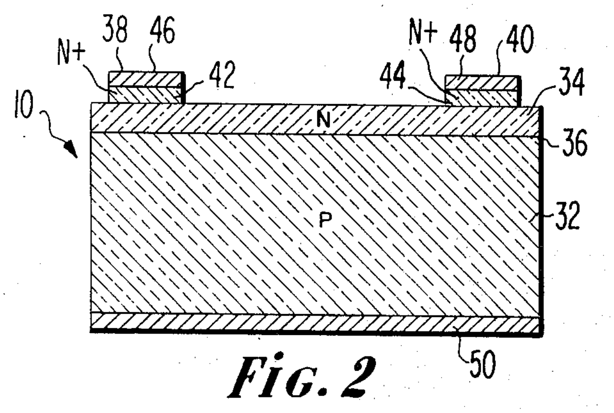
FIG. 2 is a cross-sectional view of one embodiment of the present invention.

Referring generally to FIG. 2, the construction of the improved field effect transistor 10 of the present invention is shown. The transistor 10 comprises a body of a semiconductor material, such as silicon or gallium-arsenide which is used in the preferred embodiment. In the preferred embodiment, the body comprises a P-type substrate 32 and an N-type epitaxial layer 34 formed on the P-type substrate 32, with a PN junction 36 therebetween. Ohmic 38, 40 comprising highly doped N+ type regions 42, 44 are epitaxially grown upon the N-type layer 34. The ohmic contacts 38, 40 further comprise metallic contact electrodes 46, 48 formed upon the N+ type regions 42, 44, respectively. A metallic contact 50 is formed on the side of the P-type substrate 32 opposite the PN junction 36.

Certain impurity materials in some semiconductors, such as gallium-arsenide, have the characteristic of causing the semiconductor material to be heavily P-(or N) type while also being of high resistivity. The reason for this is that the acceptor (or donor) levels are relatively deep, meaning that they are relatively far from the energy level of the valence (or conduction) band. By "relatively far" is meant more than about 0.1 eV. This means that the doping concentration of the substrate 32 can be made to be greater than or equal to the doping concentration of the layer 34 while having a resistivity of greater than 500 ohm-cm for the substrate 32.

Examples of such impurities are iron doped gallium-arsenide which is P-type and has an acceptor level that is 0.3 eV deep or chromium doped gallium-arsenide which is also P-type and has an acceptor level that is 0.7 eV deep. Examples for N-type impurities are silver or mercury doped silicon, which have donor levels which are each 0.3 eV deep. This means that a very small fraction of the impurities are ionized which gives the substrate 32 a very low conductivity. The resistivity for typical iron impurity concentrations on the order of $10^{16}$–$10^{17}/cm^3$ is on the order of $10^4$ ohm—cm while the resistivity for typical chromium impurity concentrations is on the order of $10^7$ ohm-cm.

In the preferred embodiment of the transistor 10, the N-type layer 34 is approximately 1 micron thick and is doped with an impurity density of about $10^{16}$ atoms/$cm^3$. The P-type substrate 32 is made to be about 100 microns thick and has an impurity density of about $4 \times 10^{16}$ atoms/$cm^3$. It can therefore be found that the time required to deplete the N-type layer 34 of carriers will be directly proportional to the resistivity of the P-type substrate 32. In particular, the time required can be found by the formula:

$$T = 2\epsilon t_s \rho_s / t_e$$

where $\epsilon$ is the permittivity of the epitaxial material, $t_s$ and $\rho_s$ the thickness and the resistivity, respectively, of the substrate 32, and $t_e$ is the thickness of the epitaxial layer 34. The permittivity of the material, $\epsilon$, is approximately $10^{-12}$ farads/cm. The thickness of the substrate 32, $t_s$, and the thickness of the epitaxial layer 34, $t_e$, have been chosen to be about 100 microns and 1 micron, respectively, in the device of the preferred embodiment. The formula can, therefore, be simplified to:

$$T = 2 \times 10^{-10} \rho_s.$$

Thus, to have switching times on the order of a microsecond, it will be necessary to use an acceptor impurity such as iron in doping the substrate 32. In general, the substrate 32 should be at least one order of magnitude greater in thickness than the layer 34 in order to help increase the switching speed.

Alternatively, the switching speed for gallium-arsenide doped with acceptors such as chromium can be increased by shining infrared light on the substrate 32 in order to excite the acceptor levels. Visible light cannot be shined on the substrate 32 as that would excite electrons in the N-type epitaxial layer 34, thereby increasing the leakage current and causing a voltage drop across the substrate 32 instead of across the PN junction 36. Such a voltage drop would prevent the depletion of carriers from the N-type layer 32, thereby preventing the transistor from turning "OFF."

Using iron doping in the preferred embodiment of the transistor 10, and using the dimensions and doping previously given for the substrate 32 and the epitaxial layer 34, a switching voltage on the order of 10 volts applied to reverse bias the PN junction 36 will be sufficient to deplete the N-type layer 34 of carriers. This switching voltage is applied between the metallic contact 50 and either of the ohmic contacts 38, 40 so that the voltage applied to the metallic substrate 50 is negative with respect to that applied to either of the ohmic contacts 38, 40.

In order to operate the transistor 10 in the "ON" condition, no switching voltage is applied to the metallic contact 40. There will be a conductive path between the ohmic contacts 38, 40 due to the free carriers in the epitaxial layer 34.

Because the signal flows between the ohmic contacts 38 and 40 when the switch is "ON," it is desirable to have a very small resistance between them. The 1 micron thick N-type layer 34 of gallium-arsenide with an impurity concentration of $10^{16}$ atoms/cm$^3$ has a sheet resistance of about 1,000 ohms/square. As it is possible to separate the ohmic contacts 38, 40 by about 5 microns without taxing the capabilities of photolithographic techniques, a 1 ohm resistance between the ohmic contacts 38, 40 will be obtained if the ohmic contacts are separated by 5 microns for a length of about 0.5 cm.

Figure 3:
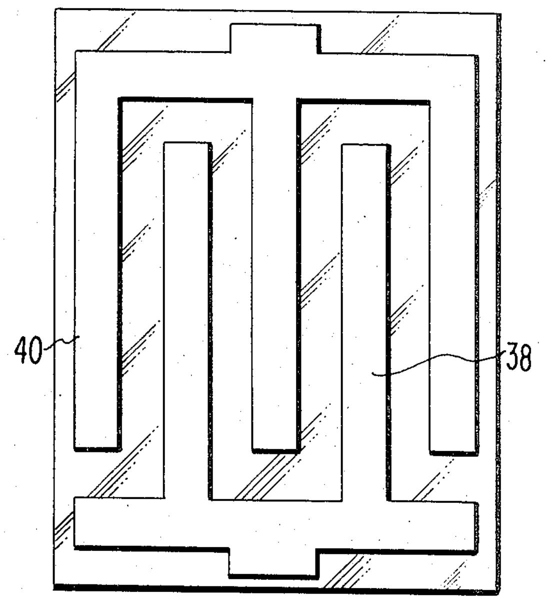
FIG. 3 is a top view of the one embodiment of the present invention.

Referring generally to FIG. 3, the ohmic contacts 38, 40 are shown as interdigitated fingers having widths of 3 microns and separated by about 5 microns. By interdigitating the contacts 38, 40 it is possible to have their length effectively be many times their separation without having a device which is very long and thin.

Figure 4:
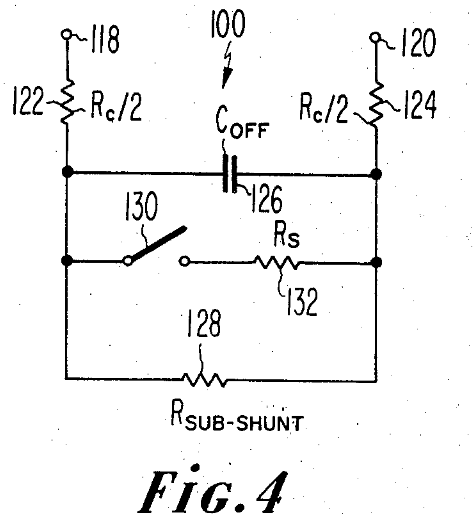
FIG. 4 is a schematic representation of a circuit model of the transistor as seen by a signal.

Referring generally to FIG. 4, an equivalent circuit model 100 of the solid switch 10 as seen by the signal, is shown. The equivalent circuit model 100 comprises two terminals 118, 120, which correspond to the ohmic contacts 38, 40 of the solid state switch 10. The model 100 further comprises two resistors 122, 124 of value $R_c/2$, wherein $R_c$ is approximately 0.2 ohm and corresponds to the resistance between the ohmic contacts 38, 40 and the N-type layer 34 of the switch 10, a capacitor, $C_{OFF}$ 126, corresponding to the "OFF" capacitance of the switch 10 and equal to about 0.25 pF. The capacitor 126 is connected between the two terminals of the resistors 122, 124 which are not connected to the ohmic contacts 118, 120. Connected in parallel with the capacitor 126, is a resistor, $R_{SUB\text{-}SHUNT}$ 128 which corresponds to the substrate "OFF" resistance of about 40,000 ohms. Also connected in parallel with the capacitor 126 is a switch 130 in series with a resistor, $R_S$ 132. The resistor, $R_S$ 132, corresponds to the 1 ohm resistance of the N-type layer 34 between the ohmic contacts 38, 40.

Figure 5:
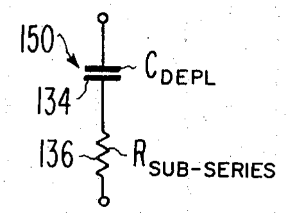
FIG. 5 is a schematic representation of a circuit model of the transistor as seen by a driving voltage.

Referring generally to FIG. 5, an equivalent circuit model 150 of the switch 10 as seen by the driver circuitry is shown. This model 150 contains a capacitor, $C_{DEPL}$ 134, connected in series with a resistor, $R_{SUB\text{-}SERIES}$ 136. The capacitor 134 in the model 150 corresponds to the capacitance of the N-type layer 14 of the switch 10 which is about 6 pF, and the resistor 136 corresponds to the substrate series resistance as seen by the driver source of about 160,000 ohms. Thus, the RC time constant as seen by the driver of the switch will be on the order of one microsecond.

As seen by the switched signal, the solid state switch 10 disclosed herein will have a low "ON" resistance between the ohmic contacts 38, 40 while having a high "OFF" resistance between these contacts 18, 20. Thus, signals sent through contacts 38, 40 of the switch 10 will be effectively switched. At the same time, the driver of the switch 10 will be effectively isolated from the signal circuit by the large value of the resistor, $R_{SUB\text{-}SERIES}$ 136 but the low value of the $R_{SUB\text{-}SERIES}$ $C_{DEPL}$ constant will allow the switch to be operated at a very rapid rate.

From the foregoing description of the preferred embodiment of the solid state switch 10, it can be seen that the switch 10 differs from a conventional JFET in that the substrate 32 of the switch 10 has a high resistivity while having a high impurity concentration, whereas the gate region of a conventional JFET has a high conductivity. Because of the high resistivity of the substrate 32, the capacitive path between the ohmic contacts 38, 40 and the substrate 32 will have very little effect upon the "OFF" characteristic of the switch 10. In a conventional JFET, the capacitive effect is considerable, so it is avoided by forming a channel of one conductivity type in the JFET corresponding to the layer 34 of the switch 10 and then by diffusing impurities of a second conductivity type into the JFET to form a gate region of a second conductivity type and the PN junction corresponding to junction 36. The PN junction of a conventional JFET is formed only between the contacts which would correspond to the ohmic contacts 38, 40. Thus, in a conventional JFET, the gate region which corresponds to the substrate 32 is above the channel corresponding to the layer 34 and not below it as in the present invention.

The present invention thereby eliminates the capacitive effects of the conventional JFET by not having the gate region below the ohmic contacts. Having the gate region between the ohmic contacts is necessary in a conventional JFET in order to eliminate a path which would exist through the highly conductive gate region.

In the switch 10 of the present invention, the substrate 32 can underlie the ohmic contacts 38, 40 without regard to capacitive effects between the contacts 38, 40 and the substrate 32 due to the high substrate shunt resistance represented by $R_{SUB\text{-}SHUNT}$ 128 in the model of the switch 10 shown in FIG. 4. The structure of the present invention allows for very fast depletion of carriers from the layer 34, thereby allowing the switch to turn "OFF" very rapidly. As is obvious to one skilled in the art, this rapid turn off is accomplished by depleting the layer 34 of carriers by reverse biasing the PN junction 36. This is accomplished by switching the driver voltage which is applied between the metallic contact 50 and one of the ohmic contacts 38, 40.

Figure 1:
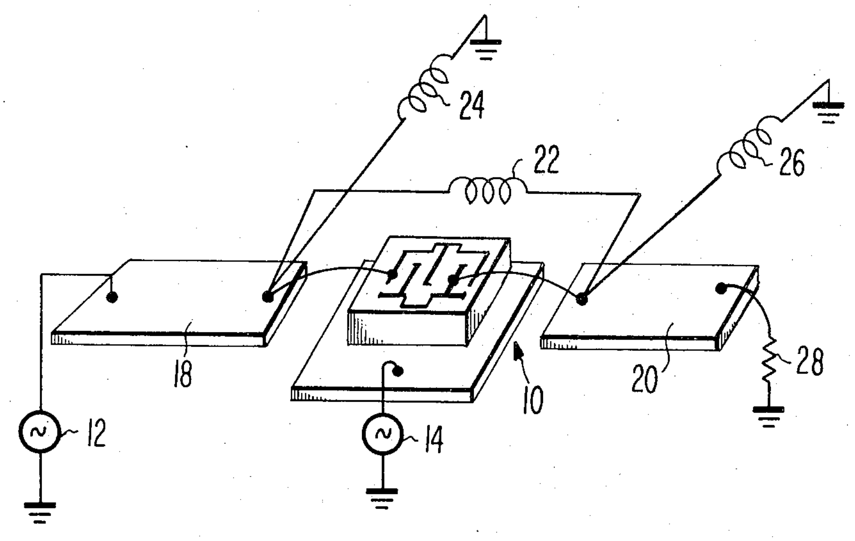
FIG. 1 is a view of a portion of a system employing the transistor of the present invention.

Referring now generally to FIG. 1, a portion of a system employing the transistor 10 is shown. The portion shown comprises the improved junction field effect transistor 10 of the present invention, a microwave oscillator 12, a source of switching voltage 14, a transmission line element 18 connecting the microwave oscillator 12 to a field effect transistor 10, and a transmission line element 20 connecting the field effect transistor 10 to a load element 28. This portion of the system further comprises a coil 22 which is used for tuning and radio frequency chokes 24, 26 which are used to allow for DC biasing of the field effect transistor 10.

A source of swithcing voltage 14 is used to provide a negative voltage of from 10 to 20 volts to the field effect transistor 10 in order to turn it "OFF," thereby opening the circuit between the transmission line elements 18, 20. Removing the negative voltage from the field effect transistor 10 will turn it "ON" thereby closing the circuit between the transmission line elements 18, 20.

In order to make the switch 10 of the preferred embodiment of the present invention, one starts off with a wafer of a semiconductor such as gallium-arsenide upon which one grows an appropriately doped epitaxial layer. In the preferred embodiment this would be a P-type substrate 12 having an impurity density of about $4 \times 10^{16}$ iron atoms/cm$^3$. The substrate 32 is grown to be about 100 $\mu$ thick. On the substrate 32 is grown a 1 $\mu$ thick N-type epitaxial layer having an impurity concentration of about $10^{16}$ atoms/cm$^3$. On this N-type layer 34 a highly doped $N^+$ layer is grown to a thickness of about 0.5 $\mu$. Using standard photolithographic techniques, the metallic contact electrodes 46, 48 are deposited and defined upon the $N^+$ layer in the form of interdigitated fingers. Then, by using standard photoresist techniques, the $N^+$ region between the metal contacts 46, 48 is etched away, exposing the N-type layer 34, except where the $N^+$ layer was protected by the metallic contacts 46, 48, Where the $N^+$ layer was protected by the metallic contacts 46, 48, $N^+$ regions 42, 44 will remain underlying the metallic contacts 46,

48, respectively. The gallium-arsenide wafer is then etched away, exposing the P-type substrate 32 and a metallic contact 50 is formed thereon.

While the preferred embodiment of the present invention uses gallium-arsenide meterial with a P-type substrate, other semiconductor materials such as silicon or germanium can also be used. Also, the substrate can be made to be either P- or N-type with a suitable impurity chosen.

Examples of suitable impurity-semiconductor combinations for a P-type substrate would be iron for gallium-arsenide, cobalt for silicon, and manganese for germanium. Examples for an N-type substrate would be sulfur for silicon and selenium for germanium. These examples are provided merely as an illustrative list and are not meant to be exhaustive, and other suitable combinations will be obvious to one skilled in the art.

We claim:

1. A solid state switch comprising:

a. a substrate of a first conductivity type having a resistivity in the order of 10,000 ohm-cm;

b. a layer of a second conductivity type on said substrate forming a PN junction with said substrate, said layer having a sheet resistivity of less than 2,000 ohm/square while having an impurity concentration of less than that of said substrate;

c. at least two ohmic contacts on said layer, and d. a metallic contact on said substrate.

2. The solid state switch of claim 1 wherein said substrate is comprised of gallium-arsenide.

3. The solid state switch of claim 2 wherein said first conductivity type is P-type and said impurity concentration is comprised of an acceptor which is a member of the group consisting of chromium, iron, nickel, and cobalt.

4. The solid state switch of claim 2 wherein said layer is at least one order of magnitude thinner than said substrate.

5. The solid state switch of claim 4 wherein said layer has a thickness of less than 2 microns.

6. The solid state switch of claim 4 wherein said impurity concentration of said substrate is at least $4 \times 10^{16}$ atoms/cm$^3$.

7. The solid state switch of claim 6 wherein said second conductivity type is formed by an impurity concentration of at least $10^{16}$ atoms/cm$^3$.

8. The solid state switch of claim 1 wherein said ohmic contacts comprise a region of said second conductivity type between said layer and each of said ohmic contacts, said region having an impurity concentration greater than that of said layer.

9. The solid state switch of claim 8 wherein said ohmic contacts are comprised of interdigitated fingers spaced so as to provide a resistance of less than 10 ohms between them.

10. The solid state switch of claim 1 wherein said metallic contact on said substrate is on the side of said substrate opposite said PN junction.

* * * * *

Disclaimer 3,855,613.—*Louis Sebastian Napoli*, Hamilton Square, and *Raymond Harkless Dean*, Lawrenceville, N.J. A SOLID STATE SWITCH USING AN IMPROVED JUNCTION FIELD EFFECT TRANSISTOR. Patent dated Dec. 17, 1974. Disclaimer filed Jan. 21, 1977, by the assignee, *RCA Corporation*.

Hereby enters this disclaimer to claim 3 of said patent.

[*Official Gazette March 22, 1977.*]